(12) United States Patent
Taga et al.

(10) Patent No.: US 6,896,953 B2
(45) Date of Patent: May 24, 2005

(54) WIRING BOARD AND PROCESS OF PRODUCING THE SAME

(75) Inventors: Shigeru Taga, Nagoya (JP); Hiroyuki Takahashi, Kasugai (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/703,424

(22) Filed: Nov. 10, 2003

(65) Prior Publication Data

US 2004/0096634 A1 May 20, 2004

(30) Foreign Application Priority Data

Nov. 11, 2002 (JP) .................................... P. 2002-327453
Sep. 25, 2003 (JP) .................................... P. 2003-332709

(51) Int. Cl.⁷ .............................................. B23B 3/00
(52) U.S. Cl. ..................................... 428/210; 174/258
(58) Field of Search ........................... 174/258; 428/210

(56) References Cited

U.S. PATENT DOCUMENTS 4,766,027 A * 8/1988 Burn ........................... 428/210
5,102,720 A * 4/1992 Raj .............................. 428/209
5,254,191 A   10/1993 Mikeska et al.
5,593,526 A * 1/1997 Yokouchi et al. ......... 156/89.15
5,635,301 A * 6/1997 Kondo et al. ............... 428/426
6,337,123 B1   1/2002 Ryugo et al.
6,468,640 B2  10/2002 Nishide et al.
6,528,145 B1 * 3/2003 Berger et al. ............... 428/156
6,753,277 B2 * 6/2004 Terashi ......................... 501/32

FOREIGN PATENT DOCUMENTS

| JP | 4-243978 A | 9/1992 |
| JP | 2554415 B2 | 8/1996 |
| JP | 2001-119143 A | 4/2001 |
| JP | 2001-291955 A | 10/2001 |
| WO | WO 03/029166 A2 | 4/2003 |

* cited by examiner

Primary Examiner—Cathy F. Lam
(74) Attorney, Agent, or Firm—Sughrue Mion, PLLC

(57) ABSTRACT

A wiring board including a laminate comprising: a low-temperature fired layer comprising ceramic particles α and a glass component; and a ceramic layer comprising ceramic particles β that do not sinter at the firing temperature of the low-temperature fired layer and a glass component, wherein the ceramic particles β have a mean particle size larger than that of the ceramic particles α and a specific surface area smaller than that of the ceramic particles α.

6 Claims, 3 Drawing Sheets

WIRING BOARD AND PROCESS OF PRODUCING THE SAME

FIELD OF THE INVENTION

The present invention relates to a wiring board that is less in firing shrinkage in the planar direction and a process of producing the same.

BACKGROUND OF THE INVENTION

In recent years, in wiring boards used in the mobile communication field, etc., low-temperature fired boards that can sinter simultaneously with low-resistance conductors such as Ag, Au, Cu, and Pd are used. Also, in the mobile communication field, while individual electronic parts are miniaturized, development of module parts integrated with such parts is advanced. For boards to be used in such module parts, module boards to which a low-temperature fired board is applied are widely used, and individual electronic parts, etc. are mounted on the surface of such a board with a solder. In the mounting step, solder paste printing or mounting of parts is carried out. In general, the mounting is carried out in the mode of a large-sized board for multi-cavity having a number of module boards.

In the foregoing large-sized boards, for the sake of cutting down the manpower of the mounting step, in recent years, it is designed to make the size large so as to realize a square having a side of from 100 mm to 200 mm. For that reason, for the purpose of keeping the registration in the mounting step, dimensional precision or alignment precision of individual module boards is becoming severe. For the sake of attaining such dimensional precision, a shrinkage-free firing method that is not substantially accompanied with shrinkage in the planar direction and in which scattering in size at the time of firing hardly occurs is effective.

Hitherto, as a method of reducing the firing shrinkage of ceramic bodies, there is known a method in which a flexible constraining layer that does not sinter at the firing temperature of the ceramic body is applied, the ceramic body is fired, and the unfired porous constraining layer is removed from the fired ceramic body (see, for example, Japanese Patent No. 2,554,415 (pages 1 to 13 and FIG. 3)). This method involved a problem such that the costs are high because a step of removing the porous constraining layer is necessary after firing.

Also, there is proposed a process of producing a multi-layered ceramic board in which in firing a pair of low-temperature firing green sheets made of a different material from each other while putting therebetween a green sheet for repressing shrinkage that does not sinter at the firing temperatures thereof, glass components in the low-temperature firing green sheets are diffused into the green sheet for repressing shrinkage and sintered (see, for example, JP-A-2001-119143 (pages 1 to 10 and FIG. 2)).

According to this process, not only a three-layer structure for forming a composite material comprising a pair of low-temperature firing green sheets having a green sheet for repressing shrinkage put therebetween was always necessary, but also desirable diffusion and sintering of the glass components were not solved yet.

SUMMARY OF THE INVENTION

An object of the invention is to solve the problems described previously in the background art and to provide a wiring board that is less in firing shrinkage in the planar direction and a production process for surely obtaining the same. Incidentally, in this description, the term "low-temperature firing (sintering)" means that an internal glass component sinters at a temperature of not more than about 1,000° C., and the term "glass component" means a glass matrix. Also, in this description, the term "firing shrinkage" means that the wiring board shrinks, at firing, in the planar direction by sintering of the glass component.

The invention has been made while paying attention to practical use of a laminate of ceramics having a different concentration of the glass component from each other.

Specifically, the wiring board of the invention is characterized by including a laminate comprising a low-temperature fired layer comprising ceramic particles α and a glass component; and a ceramic layer comprising ceramic particles β that do not sinter at the firing temperature of the low-temperature fired layer and a glass component, wherein the ceramic particles β have a mean particle size larger than that of the ceramic particles α and a specific surface area smaller than that of the ceramic particles α.

Also, the invention also includes, as a preferred embodiment, the wiring board, wherein the glass component of the ceramic layer is a glass component resulting from movement of a part of the glass component of the low-temperature fired layer.

According to these embodiments, the low-temperature fired layer and the ceramic layer are respectively fired at a low temperature by sintering of each of glass components. Moreover, in contrast to the low-temperature fired layer comprising ceramic particles α and a glass component, the ceramic layer in which a part of the glass composition sinters (is solidified after movement and diffusion) and which contains ceramic particles β having a mean particle size larger than that of the ceramic particles α imparts a force of constraint in the planar direction to the adjacent low-temperature fired layer.

Accordingly, the foregoing wiring board including a laminate having less firing shrinkage, which comprises a low-temperature fired layer and a ceramic layer, has high and stable dimensional precision. For that reason, the invention is suitable for mass production by a large-sized board for multi-cavity having such a wiring board.

Incidentally, in this description, the term "sintering" means a phenomenon where the particles (powders) cause adhesion to each other and are then solidified. Also, the ceramic particles α and the ceramic particles β may be a ceramic having the same component formulation each other (such as alumina ($Al_2O_3$), mullite, and aluminum nitride). Further, the ceramic particles α and the ceramic particles β may be each one comprising two or more kinds of ceramic particles (such as an inorganic filler α1 for strength enhancement, an inorganic filler α2 for dielectric enhancement, and an inorganic filler α3 for repression of coefficient of thermal expansion). Also, the ceramic layer previously contains a small amount of the glass component (powder) along with the ceramic particles β and contains a material having sintered together with the glass component that has moved and diffused from the low-temperature fired layer.

Also, the invention includes, as a preferred embodiment, the wiring board, wherein the ceramic particles β have a mean particle size larger than that of the ceramic particles α by 1 µm or more and a specific surface area smaller than that of the ceramic particles α by 0.2 $m^2$/g or more. According to this embodiment, since the glass component (powder) is surely moved to and diffused into the ceramic layer from the low-temperature fired layer, the ceramic particles β having a large mean particle size and the moved glass component sinter in the ceramic layer. Accordingly, firing shrinkage of the low-temperature fired layer containing ceramic particles α having a small particle size, which is adjacent to the ceramic layer, is surely repressed.

Incidentally, when a difference between the mean particle size of the ceramic particles β and that of the ceramic particles α is less than 1 μm, and a difference between the specific surface area of the ceramic particles β and that of the ceramic particles α is less than 0.2 m²/g, movement of the glass component (powder) necessary for sintering from the low-temperature fired layer to the ceramic layer is insufficient. Accordingly, such an embodiment has been excluded from the scope of the invention.

Further, the invention includes, as a preferred embodiment, the wiring board, wherein a plural number of laminates comprising the low-temperature fired layer and the ceramic layer are laminated along the thickness direction, and a wiring layer is formed at least between the low-temperature fired layer and the ceramic layer or among the laminates.

According to this embodiment, a wiring layer made of Ag, Au, Cu, Pd, etc. is formed between the laminates having less firing shrinkage in the planar direction or inside each laminate at the same time of sintering of the glass powder. For that reason, the resulting wiring board is a wiring board containing such wiring layers and via conductors conducting thereto and having high dimensional precision and electrical reliability.

On the other hand, the process of producing a wiring board of the invention is characterized by including a lamination step of alternately laminating a green sheet for low-temperature fired layer comprising ceramic particles α and a glass powder and a green sheet for ceramic layer containing ceramic particles β that do not sinter at the firing temperature of the green sheet for low-temperature fired layer; and a firing step of firing the resulting green sheet laminate at the firing temperature of the green sheet for low-temperature fired layer, wherein the ceramic particles β have a mean particle size larger than that of the ceramic particles α and a specific surface area smaller than that of the ceramic particles α, and wherein in the firing step, a part of a glass component is supplied to the green sheet for ceramic layer from the green sheet for low-temperature fired layer.

According to this embodiment, since the glass powder contained in the green sheet for low-temperature fired layer surely diffuses into the green sheet for ceramic layer and sinters in the firing step, the resulting ceramic layer is less in firing shrinkage in the planar direction than the low-temperature fired layer and exhibits a force of constraint. For that reason, it is possible to make the dimensional precision of the wiring board including a laminate comprising the low-temperature fired layer obtained by the sintering step and the ceramic layer high and stable.

Incidentally, the foregoing green sheet for ceramic layer includes a mode of previously containing a small amount of a glass powder along with the ceramic particles β. Also, it is possible to obtain a multilayered wiring board by forming a metallized ink of Ag, Au, Cu, Pd, etc. in a prescribed pattern on the surface of each green sheet or the green sheet laminate or filling the foregoing ink in via holes passing through each of the sheets and then carrying out the foregoing respective steps.

Also, the invention includes, as a preferred embodiment, the process of producing a wiring board, wherein in the low-temperature fired layer comprising the ceramic particles α obtained in the firing step and the residual glass component, a weight ratio of the ceramic particles α to the glass component is substantially 1:1. According to this embodiment, since the amount of the glass component that retains and sinters in the low-temperature fired layer is proper, it is possible to not only prevent excessive sintering but also reduce firing shrinkage of the low-temperature fired layer itself. Accordingly, the dimensional precision of the wiring board including a laminate comprising the low-temperature fired layer and the ceramic layer adjacent thereto and having the moved glass component having sintered therein is more surely enhanced. Incidentally, the term "substantially 1:1" means that a weight ratio of the foregoing ceramic particles α to the foregoing glass component falls within the range of 50%±11% (preferably±10%).

A sectional view to show one embodiment of a wiring board of the invention.

[FIG. 2]

A typical sectional view to show a laminate used in the foregoing wiring board.

[FIG. 3]

A schematic view to show the lamination step in the process of producing a wiring board of the invention.

[FIG. 4]

A schematic view to typically show the firing step in the foregoing production process.

[FIG. 5]

A schematic view to show the foregoing laminate in the firing step.

[FIG. 6]

Figure 1:
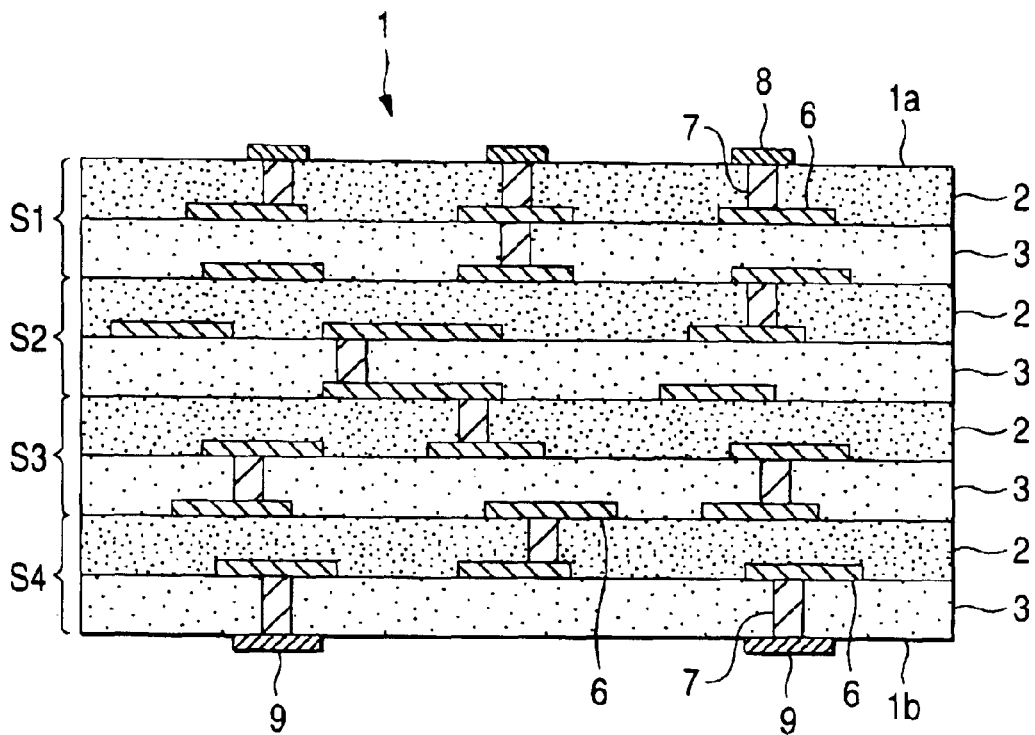
[FIG. 1]

A cross-sectional view to show an application mode of the wiring board of FIG. 1.

DESCRIPTION OF REFERENCE NUMERALS AND SIGNS 1, 10: Wiring board
2: Low-temperature fired layer
2': Green sheet for low-temperature fired layer
3: Ceramic layer
3': Green sheet for ceramic layer
4, 5: Glass powder/glass component
S: Laminate
S': Green sheet laminate
α, β: Ceramic particles

DETAILED DESCRIPTION OF THE INVENTION

The best mode for carrying out the invention will be described below with reference to the drawings.

Figure 2:
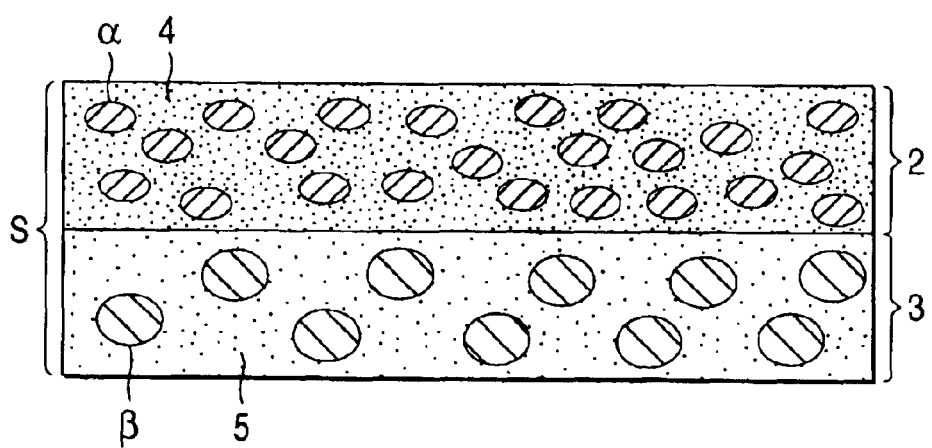

FIG. 1 is a sectional view of a wiring board 1 of the invention, and FIG. 2 is a typical sectional view of a laminate S included in the wiring board 1. The wiring board 1 is an integrally laminated material of a plural number of laminates S1 to S4 in the thickness direction as shown in FIG. 1.

Also, the laminate S comprises a low-temperature fired layer 2 comprising ceramic particles α and a glass component 4; and a ceramic layer 3 containing ceramic particles β that do not sinter at the firing temperature of the low-temperature fired layer 2 and a glass component 5 resulting from movement and diffusion of a part of the glass powder 4 and sintering in the firing step as described later as shown in FIG. 2.

Incidentally, the mean particle size of the ceramic particles β is larger than that of the ceramic particles α, and the specific surface area of the ceramic particles β is smaller than that of the ceramic particles α. These ceramic particles α and β are made of, for example, alumina of the same component formulation, but may be made of two or more kinds of ceramic particles (such as an inorganic filler α1 for strength enhancement, an inorganic filler α2 for dielectric enhancement, and an inorganic filler α3 for repression of coefficient of thermal expansion).

As shown in FIG. 1, wiring layers 6 made of Ag, Au, Cu, Pd, etc. and having a prescribed pattern are aligned among a plural number of the laminates S1 to S4 in the wiring board 1 or between the low-temperature fired layer 2 and the ceramic layer 3 of each laminate, and between the wiring layers 6, via conductors 7 pass through the low-temperature fired layer 2 and the ceramic layer 3 and conduct thereto. Also, on the surface 1a of the wiring board 1, a plural number of pads 8 are formed such that they can conduct respectively to the wiring layer 6 just under the pad 8, and these pads 8 are used for connection to non-illustrated electronic parts such as IC chips to be mounted on the surface 1a. Further, on the back surface 1b of the wiring board 1, a plural number of connection terminals 9 are formed such that they can conduct respectively to the wiring layer 6 just above the connection terminal 9, and these connection terminals 9 are used for connection to a mother board such as a printed board, on which the wiring board 1 is mounted.

As shown in FIGS. 1 and 2, the laminates S1 to S4 of the wiring board 1 comprise the low-temperature fired layer 2 formed so as to contain the ceramic particles α having a relatively small particle size by the glass component 4 resulting from sintering of the glass powder 4; and the ceramic layer 3 adjacent to the low-temperature fired layer 2 and sandwiched between the upper and lower low-temperature fired layers 2 depending upon the laminated position.

The ceramic layer 3 previously contains a small amount of the glass powder 5, or does not contain the glass powder 5 at all but is formed by containing the ceramic particles β having a relatively large particle size and a small specific surface area in reliance on the glass component 5 resulting from sintering of the glass powder 5 having been moved and diffused (supplied) from the low-temperature fired layer 2 in the firing step as described later.

For that reason, the low temperature fired layer 2 is repressed in firing shrinkage in the planar direction by the adjacent ceramic layer 3. In another word, the ceramic layer 3 restrains firing shrinkage of the adjacent low-temperature fired layer 2 in the planar direction. Consequently, according to the wiring board 1 including these laminates S1 to S4, high and stable dimensional precision can be ensured. Thus, it becomes possible to realize mass production by a large-sized board for multi-cavity having the reliable wiring board 1.

Figure 3:
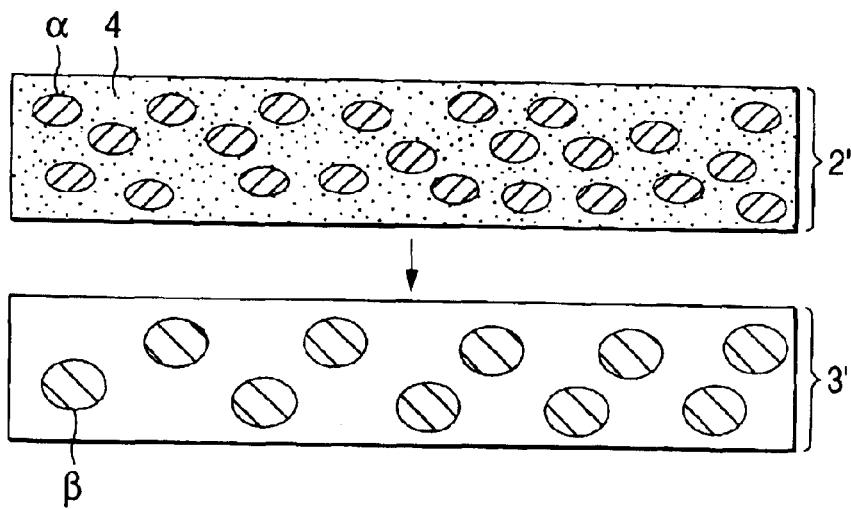
Figure 4:
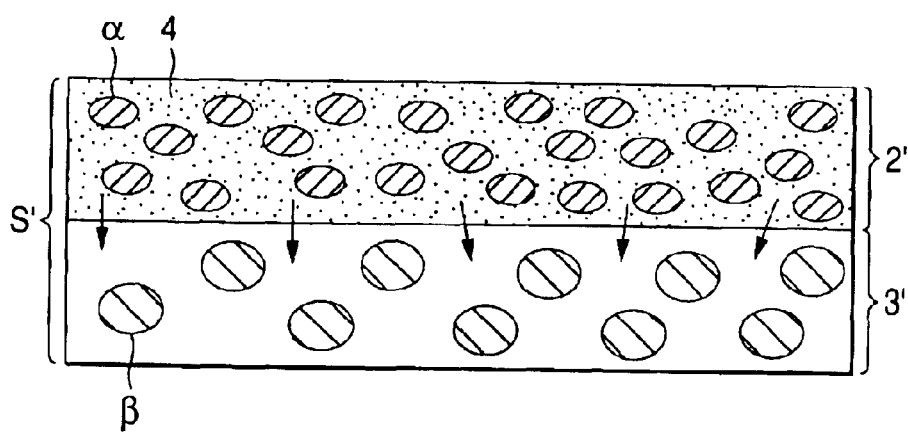
Figure 5:
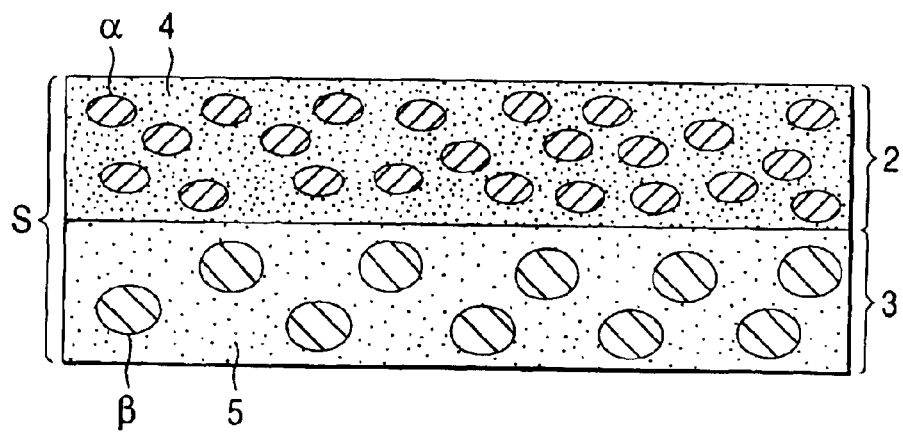

FIGS. 3 to 5 are concerned with the production process of the wiring board 1, and FIG. 3 typically shows a cross section of a green sheet 2' for low-temperature fired layer comprising the ceramic particles α and the glass powder 4 and a green sheet 3' for ceramic layer containing the ceramic particles β that do not sinter at the firing temperature of the green sheet 2' for low-temperature layer. Incidentally, the green sheet 3' for ceramic layer includes a mode of previously containing a small amount of the glass powder 5.

As described previously, the ceramic particles β are set up so as to have a mean particle size larger than that of the ceramic particles α by 1 μm or more and a specific surface area smaller than that of the ceramic particles α by 0.2 m²/g or more.

First of all, the green sheet 2' for low-temperature fired layer and the green sheet 3' for ceramic layer are laminated along the thickness direction as shown by an arrow in FIG. 3. Actually, the sheet 2' and the sheet 3' are alternately laminated (lamination step).

As a result, a green sheet laminate S' comprising the green sheet 2' for low-temperature fired layer and the green sheet 3, for ceramic layer is obtained as shown in FIG. 4. The sheet laminate S' is inserted into a non-illustrated firing furnace and heated for firing at from 800 to 900° C. over several tens minutes (firing step).

In the firing step, a part of the glass powder 4 in the green sheet 2' for low-temperature fired layer moves (is supplied) to the side of the green sheet 3' for ceramic layer and diffuses substantially uniformly as shown by arrows in FIG. 4. That is, a part of the glass powder 4 excessively contained in the green sheet 2' containing ceramic particles α having a small mean particle size and a large specific surface area penetrates into the green sheet 3' containing ceramic particles β having a large mean particle size and a small specific surface area so as to fill up spaces among the ceramic particles β.

Accordingly, in the green sheet 2', the remaining glass powder 4 sinters to become the glass component 4, whereas in the green sheet 3', the glass powder 5 having moved and diffused or the whole of this glass powder 5 and the glass powder 5 contained from the first sinters to become the glass component 5.

As a result, a laminate S comprising the low-temperature fired layer 2 comprising the ceramic particles α and the glass component 4 and the ceramic layer 3 containing the ceramic particles β that do not sinter at the firing temperature of the low-temperature fired layer 2 and the glass component 5 resulting from movement and diffusion of a part of the glass powder 4 and sintering in the firing step is obtained as shown in FIG. 5.

Actually, a metallized ink of Ag, Au, Cu, Pd, etc. is formed in a prescribed pattern on the surface of each of the green sheets 2' and 3', the foregoing ink is filled in via holes passing through each of the sheets 2' and 3', and a plural number of the sheets 2' and 3' are then alternately laminated and fired. As a result, the wiring board 1 shown in FIG. 1 is obtained. Incidentally, the foregoing lamination step and firing step may be carried out using the large-sized green sheets 2' and 3' for multi-cavity capable of forming a plural number of the wiring boards 1 of every product unit.

According to the foregoing production process of the wiring board 1, it is possible to provide surely and effectively the wiring board 1 that is extremely less in firing shrinkage in the planar direction and is excellent in dimensional precision and electrical reliability by a relatively small number of steps.

EXAMPLES

Specific Examples of the invention will be hereunder described along with Comparative Examples.

Green Sheet (2') for Low-Temperature Fired Layer

Al$_2$O$_3$ having a mean particle size and a specific surface area as shown in Table 1 and a borosilicate glass powder (4) containing SiO$_2$, Al$_2$O$_3$ and B$_2$O$_3$ as the major components were prepared as the ceramic particles α and the glass powder, respectively for every Example (Examples 1 to 5 and Comparative Examples 1 to 3). Also, an acrylic binder and DOP (dioctyl phthalate) were prepared as a binder component and a plasticizer component, respectively at the time of forming the sheet (2') for low-temperature fired layer.

The ceramic particles α (Al$_2$O$_3$) and the glass powder (4) were compounded in a compounding ratio shown in Table 1 (in Table 1, the upper row means % by weight, and the lower row means % by volume), charged in a pot along with 12 parts by weight, based on 100 parts of the foregoing powder α, of an acrylic binder and a solvent (MEK: methyl ethyl ketone) and a plasticizer (DOP) in amounts necessary for obtaining proper slurry viscosity and sheet strength, and then mixed for 5 hours in every Example, to obtain a ceramic slurry of each Example. The slurry was processed by the doctor blade method (coating method) to obtain the green sheet (2') for low-temperature fired layer having a thickness of 50 μm in every Example.

Green Sheet (3') for Ceramic Layer

Al$_2$O$_3$ having a mean particle size and a specific surface area as shown in Table 1 and having the same formulation as described previously was prepared as the ceramic particles β in every Example, and the same binder as described previously, etc. were used. Further, in Example 5 and Comparative Examples 2 and 3, the same glass powder (5) as described previously was prepared in a compounding ratio as shown in Table 1. And the green sheet (3') for ceramic layer having a thickness of 25 μm was obtained by the same method as described previously in every Example.

Incidentally, the particle size distribution of the ceramic particles α and β was measured by the laser diffraction scattering method (LA-3000, an analyzer of Horiba, Ltd.), and the specific surface area was measured by the B.T.E. method (Multisorb 12, an analyzer of Yuasa Ionics Inc.). Also, the mean particle size of the ceramic particles α and β contained in the low-temperature fired layer and the ceramic layer of the wiring board after firing was measured by the intercept method. As a result, there was found no difference from the mean particle size during the addition in the production step of the green sheet.

In every Example, the green sheet (2') for low-temperature fired layer and the green sheet (3') for ceramic layer were laminated and then laminated under pressure at a prescribed temperature (90° C.) and at a pressure (1×10$^3$ N/cm$^2$) (lamination step).

TABLE 1

| | Green sheet for low-temperature fired layer | | | | Green sheet for ceramic layer | | | |
|---|---|---|---|---|---|---|---|---|
| | Ceramic particles α | | | Glass powder | Ceramic particles β | | | Glass powder |
| | Compounding ratio (% by weight) (% by volume) | Mean particle size (μm) | Specific surface area (m/g) | Compounding ratio (% by weight) (% by volume) | Compounding ratio (% by weight) (% by volume) | Mean particle size (μm) | Specific surface area (m/g) | Compounding ratio (% by weight) (% by volume) |
| Example 1 | 35 | 3.0 | 1.0 | 65 | 100 | 5.0 | 0.6 | 0 |
| | 30.6 | | | 69.4 | 100.0 | | | 0 |
| Example 2 | 35 | 3.0 | 1.0 | 65 | 100 | 7.0 | 0.4 | 0 |
| | 30.6 | | | 69.4 | 100.0 | | | 0 |
| Example 3 | 35 | 2.0 | 1.5 | 65 | 100 | 5.0 | 0.6 | 0 |
| | 30.6 | | | 69.4 | 100.0 | | | 0 |
| Example 4 | 45 | 3.0 | 1.0 | 55 | 100 | 7.0 | 0.4 | 0 |
| | 40.2 | | | 59.8 | 100.0 | | | 0 |
| Example 5 | 35 | 3.0 | 1.0 | 65 | 90 | 4.0 | 0.8 | 10 |
| | 30.6 | | | 69.4 | 88.1 | | | 11.9 |
| Comparative Example 1 | 35 | 3.0 | 1.0 | 65 | 100 | 3.0 | 1.0 | 0 |
| | 30.6 | | | 69.4 | 100.0 | | | 0 |
| Comparative Example 2 | 35 | 3.0 | 1.0 | 65 | 95 | 3.0 | 1.0 | 5 |
| | 30.6 | | | 69.4 | 94.0 | | | 6.0 |
| Comparative Example 3 | 35 | 3.0 | 1.0 | 65 | 70 | 3.0 | 1.0 | 30 |
| | 30.6 | | | 69.4 | 65.7 | | | 34.3 |

The green sheet laminate (S') obtained in each of the Examples was cut into a square of 80 mm×80 mm, and four holes for firing dimension confirmation (inner diameter: 0.5 mm, pitch between adjacent holes: 70 mm) were perforated therein in the machine and transverse directions.

Ten hole-provided green sheet laminates (S') of each of the Examples were heated for firing at 850° C. for 30 minutes in a firing furnace to obtain ten laminates S in every Example (firing step).

With respect to the laminates S of each of the Examples, the fired state of the ceramic layer (3) was observed, and the laminate S was measured with respect to coefficient of shrinkage and its scattering. The results are shown in Table 2.

Also, in each of the Examples, the diffusion amount of the glass powder (4) having moved to and diffused into the ceramic layer (3) from the low-temperature fired layer (2) and the compounding ratio of the ceramic particles α and the residual glass component (4) in the low-temperature fired layer (2) are shown in Table 2.

Incidentally, with respect to the sintered state of the ceramic layer (3), the presence or absence of peeling from the low-temperature fired layer (2) was observed, and the results are shown in Table 2 in which the case where no peeling occurred in all of the ten samples in each of the Examples is defined as "○", and peeling occurred even in one sample is defined as "X".

Also, the diffusion amount of the glass powder (4) was measured according to quantitative analysis by the EPMA/WDS method. That is, elements detected under conditions of an acceleration voltage of 20 V and a spot size pf 10 μm were reduced into oxides, and a ratio of each element (oxide) was calculated with a total of the elements being 100. Of the detected elements, $Al_2O_3$ was considered to be the ceramic particles β, and other elements (such as $SiO_2$) were all considered to be the glass component (5).

In the light of the above, superiority of the invention will be easily understood.

It should not be construed that the invention is limited to the foregoing mode and Examples.

Figure 6:
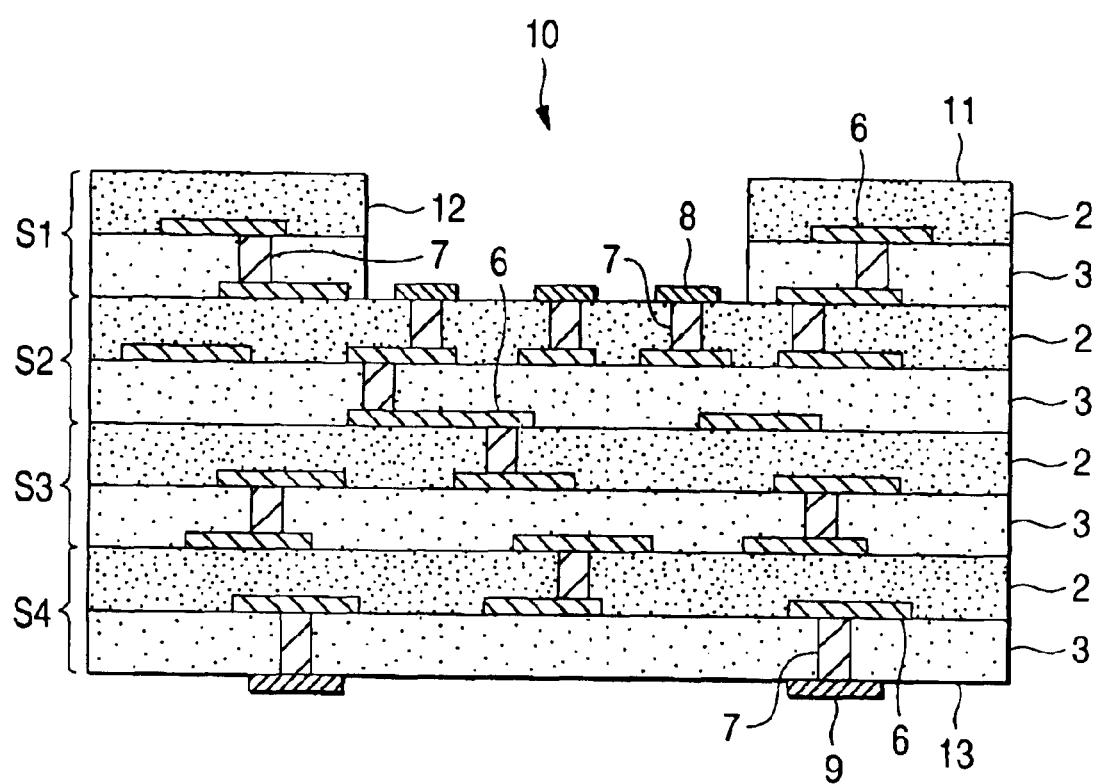

FIG. 6 shows a cross section of a wiring board 10 that is an application mode of the foregoing wiring board 1.

Likewise the foregoing mode, the wiring board 10 is one in which a plural number of laminates S1 to S4 comprising a low-temperature fired layer 2 and a ceramic layer 3 are integrally along the thickness direction as shown in FIG. 6. Further, a cavity 12 having a rectangular shape in the planar view (a square or a rectangle), which passes through the low-temperature fired layer 2 and the ceramic layer 3, is

TABLE 2

| | Sintered state of ceramic layer | Glass diffusion amount into ceramic layer (% by weight) | Formulation of low-temperature fired layer (% by weight) | | Coefficient of shrinkage of laminate (%) | Scattering in coefficient of shrinkage (3σ) |
|---|---|---|---|---|---|---|
| | | | Ceramic particles α | Glass component | | |
| Example 1 | ○ | 13 | 40.2 | 59.8 | 0.20 | ±0.10 |
| Example 2 | ○ | 17 | 42.1 | 57.9 | 0.15 | ±0.10 |
| Example 3 | ○ | 12 | 39.7 | 60.3 | 0.20 | ±0.10 |
| Example 4 | ○ | 13 | 51.7 | 48.3 | 0.30 | ±0.20 |
| Example 5 | ○ | 10 | 38.8 | 61.2 | 0.30 | ±0.20 |
| Comparative Example 1 | X (Not sintered) | 3 | 36.1 | 63.9 | — | — |
| Comparative Example 2 | X (Not sintered) | 5 | 36.8 | 63.2 | — | — |
| Comparative Example 3 | ○ | 5 | 36.8 | 63.2 | 1.90 | ±0.55 |

According to Table 2, in all of Examples 1 to 5, the sintered state of the ceramic layer 3 was good, and the coefficient of shrinkage of the laminate S was not more than 0.30% and its scattering (3σ) fell within the range of ±0.20. This is caused by the matter that the difference in mean particle size and the difference in specific surface area between the ceramic particles α and β fall within the foregoing ranges.

Moreover, it is estimated that due to the matter that a proper amount of the glass powder 4 diffused into the ceramic layer 3 from the low-temperature fired layer 2, a compounding ratio (% by weight) of the ceramic particles α and the residual glass component 4 in the low-temperature fired layer 2 became substantially 1:1 (specifically, 50%±11%), thereby revealing a balance state free from excessive sintering.

On the other hand, in Comparative Examples 1 and 2, since the ceramic layer (3) peeled apart from the low-temperature fired layer (2), the laminate S of the invention was not revealed. Also, in Comparative Example 3, though the sintered state of the ceramic layer 3 was good, the coefficient of shrinkage of the laminate S was high as 1.90%, and the scattering (3σ) was also large as ±0.55. This is because in Comparative Examples 1 and 2, since the ceramic particles α and β were equal to each other in mean particle size and specific surface area, the glass powder (4) did not sufficiently diffuse into the side of the ceramic layer (3) from the low-temperature fired layer (2). Also, in Comparative Example 3, since the glass powder (5) necessary for sintering was previously contained in the ceramic layer (3), the sintered state became good for the time being. However, it is estimated that since the ceramic particles α and β were equal to each other in mean particle size and specific surface area, a high coefficient of shrinkage and a large scattering were caused in the resulting laminate (S).

opened and formed in the side of the surface 11 on the uppermost laminate S1. On the surface of the low-temperature fired layer 2 in the laminate S2 exposed on the bottom surface of the cavity 12, a plural number of pads 8 are formed and put to practical use for connection to non-illustrated electronic parts to be mounted on the cavity 12.

Incidentally, likewise the foregoing mode, a wiring layer 6 is aligned among the laminates S1 to S4 or between the low-temperature fired layer 2 and the ceramic layer 3 of each laminate, and between the wiring layers 6, via conductors 7 pass through the low-temperature fired layer 2 and the ceramic layer 3 and conduct thereto. Also, on the back surface 13 of the wiring board 10, a plural number of connection terminals 9 are formed such that they can conduct respectively to the wiring layer 6 just above the connection terminal 9.

For the sake of producing the wiring board 10, the cavity 12 is formed in the green sheet 2' for low-temperature fired layer and the green sheet 3' for ceramic layer, both of which form the laminate S1, by punching processing in the vicinity of the center using a press, etc. immediately after the lamination step, and after laminating the other laminates S2 to S4, the resulting laminates are subjected to the firing step.

Also, different kinds of ceramic particles (including inorganic fillers) may be used for the ceramic particles α and the ceramic particles β depending upon the utilization and characteristics of the wiring board.

Further, it is possible to properly adjust the thickness of the low-temperature fired layer 2 and the ceramic layer 3 depending on the amount of the glass powder that moves to and diffuses into the latter of the glass powder 4 contained in the former.

In addition, in the firing step, the amount of the glass component 5 in the ceramic layer 3 is the minimum amount necessary for sintering, but it is desired that the weight ratio of the glass component 5 to the ceramic particles β is substantially 1:1 (50%±10 to 20%, and more desirably 50%±10 to 11%).

This application is based on Japanese Patent application JP 2002-327453, filed Nov. 11, 2002, and Japanese Patent application JP 2003-332709, filed Sep. 25, 2003, the entire contents of those are hereby incorporated by reference, the same as if set forth at length.

What is claimed is:

1. A wiring board including a laminate comprising:
    a low-temperature fired layer comprising ceramic particles α and a glass component; and
    a ceramic layer comprising ceramic particles β that do not sinter at the firing temperature of the low-temperature fired layer and a glass component,
    wherein the ceramic particles β have a mean particle size larger than that of the ceramic particles α by 1 μm or more and a specific surface area smaller than that of the ceramic particles α by 0.2 m$^2$/g or more.

2. The wiring board according to claim 1, wherein the glass component contained in the ceramic layer is a glass component resulting from movement of a part of the glass component contained in the low-temperature fired layer.

3. The wiring board according to claim 1, wherein a plural number of laminates comprising the low-temperature fired layer and the ceramic layer are laminated along a thickness direction, and a wiring layer is formed at least between the low-temperature fired layer and the ceramic layer or among the laminates.

4. The wiring board according to claim 2, wherein a plural number of laminates comprising the low-temperature fired layer and the ceramic layer are laminated along a thickness direction, and a wiring layer is formed at least between the low-temperature fired layer and the ceramic layer or among the laminates.

5. A process for producing a wiring board including a laminate, said wiring board comprising:
    a low-temperature fired layer comprising ceramic particles α and a glass component; and
    a ceramic layer comprising ceramic particles β that do not sinter at the firing temperature of the low-temperature fired layer and a glass component,
    wherein the ceramic particles β have a mean particle size larger than that of the ceramic particles α by 1 μm or more and a specific surface area smaller than that of the ceramic particles α by 0.2 m$^2$/g or more said process comprising:
    a lamination step of alternately laminating a green sheet for low-temperature fired layer containing ceramic particles α and a glass powder and a green sheet for ceramic layer containing ceramic particles β that do not sinter at a firing temperature of the green sheet for low-temperature fired layer; and
    a firing step of firing the resulting green sheet laminate at the firing temperature of the green sheet for low-temperature fired layer,
    wherein
    in the firing step, a part of a glass component is supplied to the green sheet for ceramic layer from the green sheet for low-temperature fired layer.

6. The process for producing a wiring board according to claim 5, wherein in the low-temperature fired layer comprising the ceramic particles α obtained in the firing step and the residual glass component, a weight ratio of the ceramic particles α to the glass component is substantially 1:1.

* * * * *